United States Patent [19]
Oku et al.

[11] Patent Number: 4,958,050
[45] Date of Patent: Sep. 18, 1990

[54] FLEXIBLE PRINTED CIRCUIT BOARD

[75] Inventors: Shungi Oku; Akikazu Kosho, both of Osaka, Japan

[73] Assignee: Minolta Camera Kabushiki Kaisha, Osaka, Japan

[21] Appl. No.: 351,646

[22] Filed: May 12, 1989

[30] Foreign Application Priority Data

May 13, 1988 [JP] Japan ................................. 63-63902

[51] Int. Cl.⁵ ............................................. H05K 1/00
[52] U.S. Cl. ................................ 174/261; 361/398; 439/91
[58] Field of Search .................. 174/685, 261; 439/66, 439/91; 361/398

[56] References Cited

U.S. PATENT DOCUMENTS

| | | | |
|---|---|---|---|
| 4,113,981 | 2/1978 | Fujita et al. | 174/88 R |
| 4,252,391 | 2/1981 | Sado | 174/98 X |
| 4,642,421 | 2/1987 | Dery et al. | 174/88 R |
| 4,735,847 | 4/1988 | Fujiwara et al. | 428/209 |
| 4,740,657 | 4/1988 | Tsukagoshi et al. | 174/84 RX |
| 4,808,112 | 2/1989 | Wood et al. | 439/66 |
| 4,831,278 | 5/1989 | Ueda et al. | 174/71 R X |

FOREIGN PATENT DOCUMENTS

| | | |
|---|---|---|
| 60-191228 | 9/1985 | Japan . |
| 6188136 | 6/1986 | Japan . |
| 61-194896 | 8/1986 | Japan . |

Primary Examiner—Morris H. Nimmo
Attorney, Agent, or Firm—Price, Gess & Ubell

[57] ABSTRACT

A flexible printed circuit board including an insulating flexible substrate, a plurality of first conductive terminals disposed on a front surface of said substrate for external connections, said first terminals to be glued and connected to a plurality of different conductive terminals of a different circuit board by an anisotropic conductive adhesive, and a plurality of conductive patterns disposed on a rear surface of said substrate.

11 Claims, 4 Drawing Sheets

FLEXIBLE PRINTED CIRCUIT BOARD

BACKGROUND OF THE INVENTION

1. Field of the Invention

The present invention relates to a flexible printed circuit board, and more particularly, to a flexible printed circuit board which has a plurality of conductive terminals to be glued and connected to a plurality of different conductive terminals of a different circuit board by an anisotropic conductive adhesive.

2. Description of Related Art

An anisotropic conductive adhesive has such a characteristic that the electrical conductivity vertical to the adhesive layer thereof is great but the electrical conductivity horizontal with the adhesive layer thereof is extremely small. Examples of anisotropic conductive adhesives can be found in U.S. Pat. Nos. 4,113,981 and 4,735,847.

If the anisotropic conductive adhesive is utilized for gluing a first group of conductive terminals to a second group of conductive terminals, the electric current flows through a pair of terminals of the first and second groups facing each other but the electric current hardly flows through a pair of terminals of the same group side by side to each other, owing to the above characteristic of the adhesion. Therefore, the process for connecting two groups of conductive terminals by the adhesive is quite simpler than connecting respective terminals directly, resulting in reduction of the processing time and cost.

However, there is still a desire to improve the connection of conductive terminals, with utilizing the anisotropic conductive adhesive.

SUMMARY OF THE INVENTION

An object of the present invention is to provide a flexible printed circuit board (referred to as FPC) which has a group of first conductive terminals to be glued and connected to a different group of conductive terminals of a different circuit board by the anisotropic conductive adhesive.

Another object of the present invention is to provided an FPC, having on its front surface, the first group of conductive terminals being provided and on its rear surface a second group of conductive patterns being provided.

A further object of the present invention is to provide an FPC whose first group of conductive terminals are glued and connected with a different group of conductive terminals of the different circuit board, keeping appropriate electrical conductivity and adhesion therebetween.

In order to accomplish these and other objects, the present invention includes an insulating flexible substrate, a plurality of first conductive terminals disposed on a front surface of said substrate for external connections, and a plurality of conductive patterns disposed on a rear surface of said substrate. The first conductive terminals are to be glued and connected to a plurality of different conductive terminals of a different circuit board by an anisotropic conductive adhesive.

Now, the following provides a case example where a group of conductive terminals of, for example, a liquid crystal display are glued and connected with a plurality of first conductive terminals of an FPC by the anisotropic conductive adhesive. As shown in FIG. 5, if there is provided a plurality of conductive patterns 12 in the rear of a plurality of first conductive terminals 11, on a substrate 14, unevenness appears on the surface of the first conductive terminals 11. A copper layer whose thickness is 1882 m or 3682 m is utilized as an electrical conductive material for the first conductive terminals 11 and the conductive patterns 12. As a result, the difference of the unevenness is $18\mu$ or $36\mu m$, which is equal to the thickness of the copper layer. The thickness of each anisotropic conductive adhesive layer 15, 16 and 17 is between 1082 m and $50\mu m$. As for the anisotropic conductive adhesive, electrical conductive particles and adhesive ingredients are included therein. The electrical conductive particles are difficult to move while the adhesive ingredients are easy to move in the adhesive layers 15, 16 and 17, so only the adhesive ingredients move to concave portions H of the uneven adhesive layers 15 and 16. Consequently, the concave portions H have strong adhesion but low conductivity and, on the other hand, the convex portions G have good conductivity but weak adhesion. If the ratio of the concave portions G to the convex portions H is not well-balanced, the conductivity and adhesion as a whole are deteriorated.

Additionally, when the first group of conductive terminals 11 of the FPC is glued to another group of conductive terminals of another circuit board (not shown), the pressing load is not equally dispersed on every first conductive terminal 11. Therefore, the adhesion is not provided equally for each conductive terminal 11 and the adhesion between both groups of conductive terminals becomes uneven.

Therefore, according to the present invention, the first conductive terminals and the conductive patterns are arranged so that the percentage of the portions where the first conductive terminals and the conductive patterns overlap each other may be generally constant, and so that the overlapping portions may be dispersed across a predetermined adhesion area across a predetermined adhesion area on the FPC.

Furthermore, according to the present invention, the first conductive terminals are provided on the front surface of a substrate and the conductive patterns on the rear surface, and the conductive patterns are shaped so that an overlapping between the first conductive terminal and the conductive pattern may occur and may not occur alternately along the first conductive terminal.

Furthermore, according to the present invention, a plurality of dummy patterns are provided to fill up the blank spaces between the second terminals or conductive patterns on the rear surface of the substrate, for increasing the strength of adhesion and the conductivity between the first conductive terminals of the FPC and the other terminals of the other circuit board.

In the above case, the dummy patterns are provided to fill up the blank spaces between the second terminals or conductive patterns on the rear surface, however, the dummy patterns can be provided also on the front surface to fill up the blank spaces between the first conductive terminals.

The features of the present invention which are believed to be novel are set forth with particularity in the appended claims. The present invention, both as to its organization and manner of operation, together with further objects and advantages thereof, may best be understood by reference to the following description, taken in conjunction with the accompanying drawings.

DESCRIPTION OF THE PREFERRED EMBODIMENTS

The following specification, taken in conjunction with the drawings, sets forth the product of the present invention in such a manner to enable any person skilled in the art to utilize the invention. The embodiments of the invention disclosed herein are the best modes contemplated by the inventors of carrying out their invention in a commercial environment, although it should be understood that various modifications can be accomplished within the parameters of the invention.

In a case where a group of electrical first conductive terminals of an FPC is glued to another group of conductive terminals on a different circuit board with the anisotropic conductive adhesive, the concave portions of the adhesive layer have a strong adhesion but low conductivity while the convex portions have a high conductivity but low adhesion, owing to the characteristic of the anisotropic conductive adhesive. The ratio of the concave to convex portions of respective first conductive terminals and the dispersion degree of the unevenness determine the strength of the adhesion and the conductivity between the glued terminals. As for an FPC which has a plurality of first conductive terminals on the front surface as well as a plurality of conductive patterns on the rear surface, some portions of the first conductive terminals where both the first conductive terminals and the conductive patterns being provided and overlapping each other become convex, while some portions where only the first conductive terminals being provided become concave. According to the present invention, the conductive patterns on the rear surface of the FPC is formed so that the ratio of the concave to convex portions of the first conductive terminals may be well-balanced as well as the concave and convex portions may be disperse equally everywhere across the adhesion area of the FPC. Therefore, when the first conductive terminals of the FPC is glued to the other conductive terminals of the other circuit board, the pressing load is equally dispersed for every terminal. So steady adhesion and conductivity are obtained An FPC according to an embodiment of the present invention will be subsequently described in conjunction with FIGS. 1 through 4.

Figure 1:
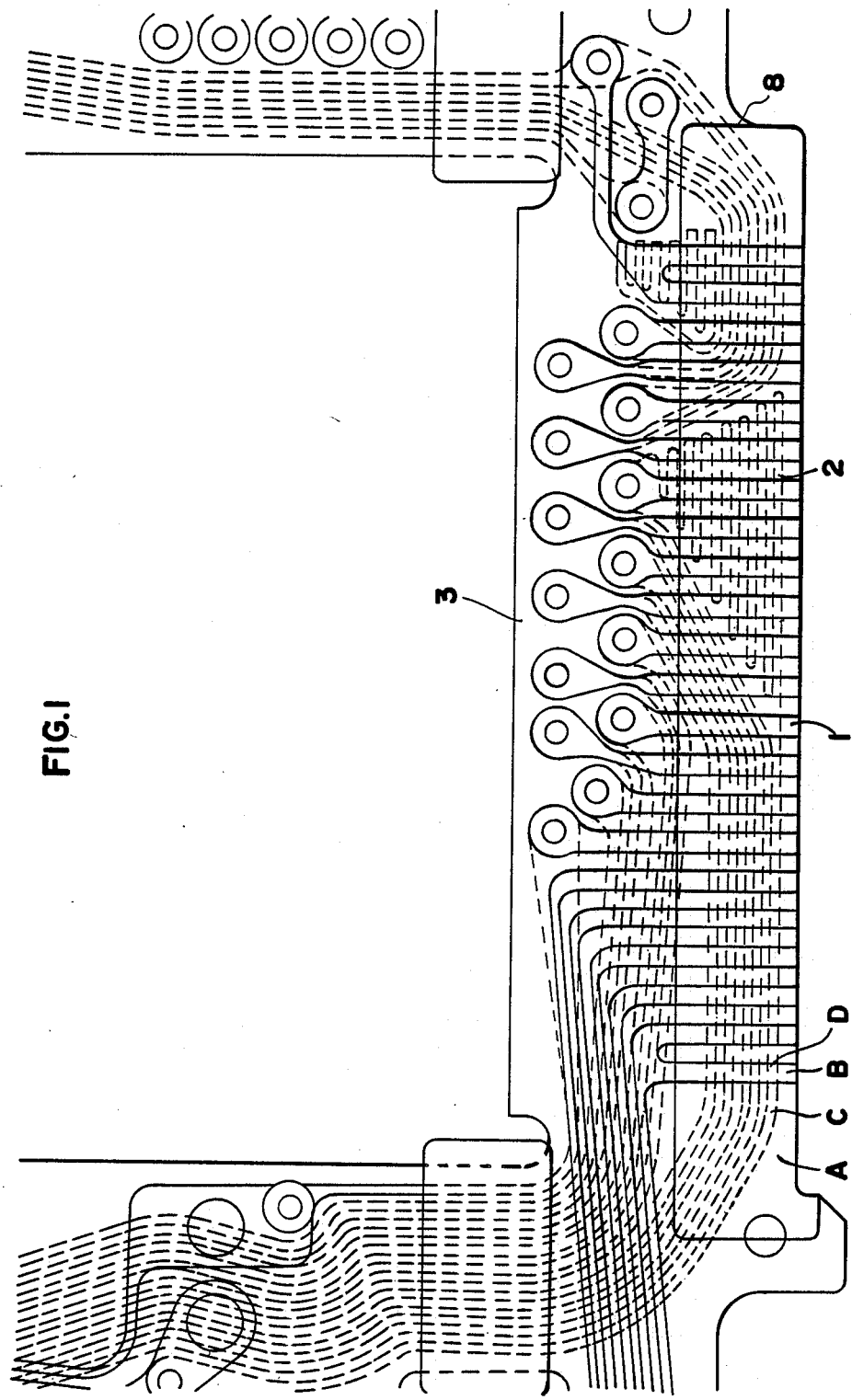
FIG. 1 shows a plan view of an FPC according an embodiment of the present invention.
Figure 2:
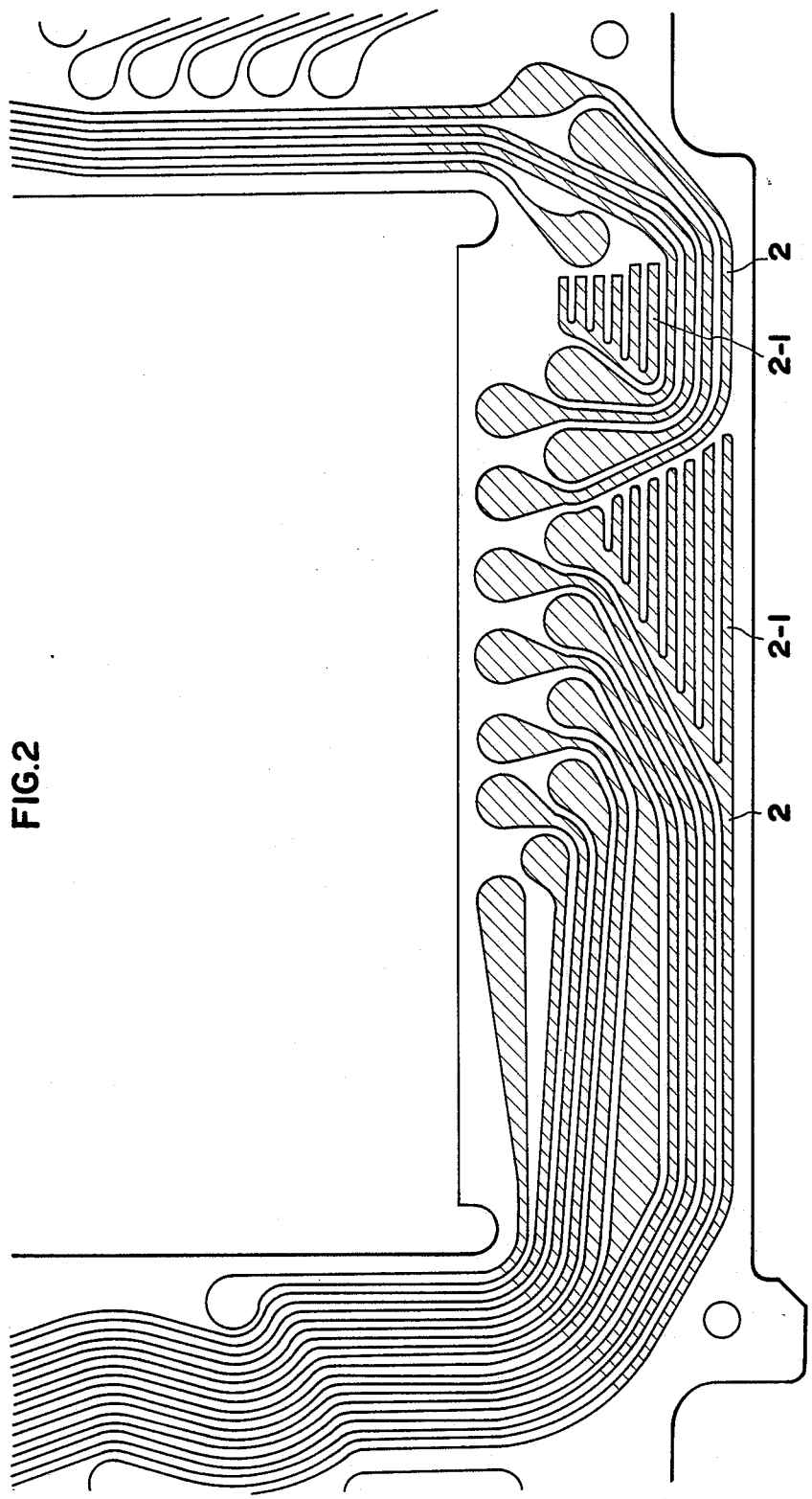
FIG. 2 shows a plan view of the FPC illustrating a plurality of conductive patterns and dummy patterns.
Figure 3:
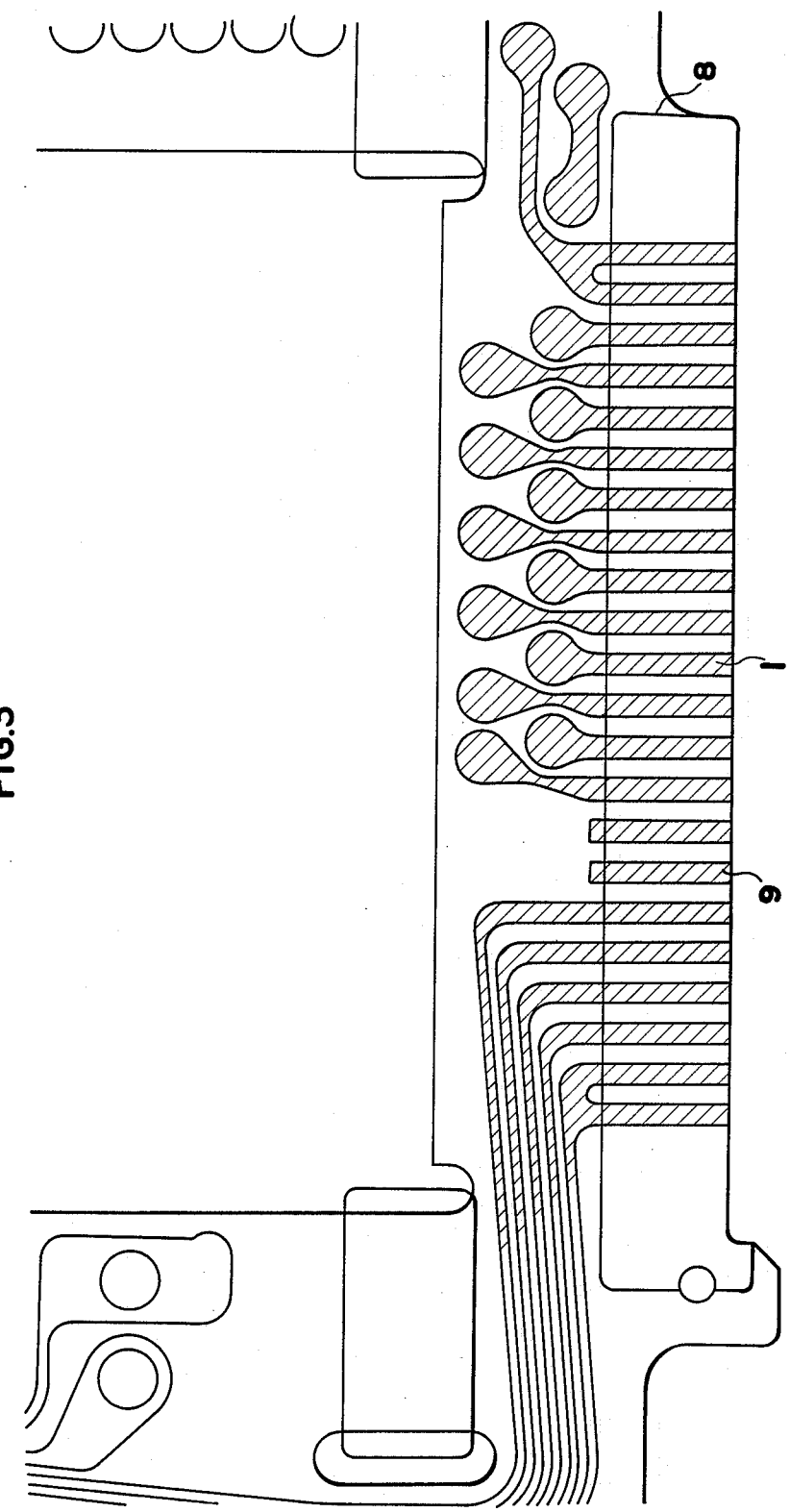
FIG. 3 shows a plan view of the FPC illustrating a plurality of first conductive terminals.

FIG. 1 shows an FPC according to an embodiment of the present invention. A plurality of terminals 1, indicated by lines slanting downward to the left, are the first conductive terminals of copper layer The first conductive terminals 1 are developed on a front surface of an insulating flexible substrate 3 and can include dummy patterns 9, as shown in FIG. 3. A plurality of patterns 2, indicated by lines slanting downward to the right shown in FIG. 1 and 2, are the conductive patterns of copper layer. The conductive patterns 2 are formed on a rear surface of the substrate 3, as shown in FIG. 2. An area 8 bounded by a solid line shown in FIG. 1 represents the desired area to be glued to another conductive terminals of another circuit board. In the bounded area 8, a cover layer covering the surface of the first conductive terminals 1 are removed to form a window 8. Furthermore in the bounded area 8, both terminals 1 and 2 are formed so that the first conductive terminals 1 on the front surface are as perpendicular as possible to the conductive patterns 2 on the rear surface, in order that the overlapping between the first conductive terminals 1 and the conductive patterns 2 may occur equally everywhere. It is difficult, however, to disperse the overlapping and non-overlapping areas uniformly everywhere because of a desired configuration of the terminals 1 and the patterns 2. Therefore, a plurality of dummy patterns 2-1 are provided to fill up the blank spaces between the conductive patterns 2 on the rear surface of the substrate 3, as shown in FIG. 2.

Figure 4:
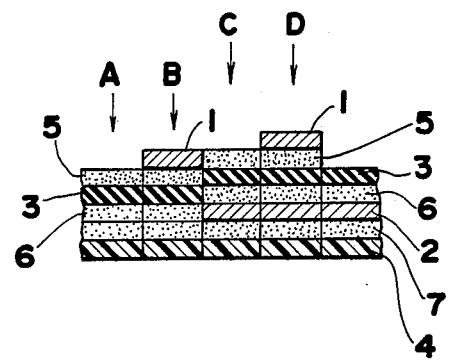
FIG. 4 shows cross-sectional views of selected portions of the FPC shown in FIG. 1.
Figure 5:
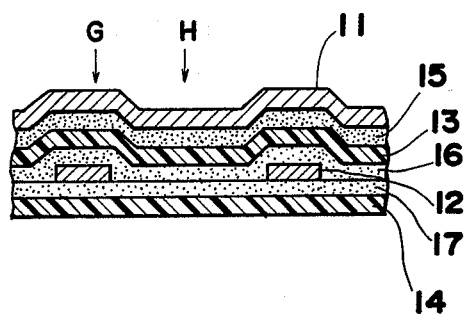
FIG. 5 shows a cross-sectional view of an FPC illustrating unevenness of the surface thereof.

FIG. 4 shows vertical sectional views of various sections of the FPC shown in FIG. 1 according to the embodiment of the present invention. Numeral 3 is the insulating flexible substrate of the FPC. On the front surface of the substrate 3, the first conductive terminal 1 is glued by the adhesive layer 5, while the conductive pattern 2 is glued on the rear surface of the substrate 3 by the adhesive layer 6. In addition, an electrical insulating material, i.e., a cover layer 4 is glued on the rear surface of the conductive pattern 2 by the adhesive layer 7. On the front surface of the first conductive terminals 1, except for the inside of the window 8, a cover layer (not shown) is glued by an adhesive layer (not shown).

In FIG. 4, sections A, B, C and D respectively indicate various glued layers of selected portions A, B, C and D inside the window 8 of the FPC as shown in FIG. 1. The bottom surface of the cover layer 4 is a standard surface for comparison of each total thickness of the glued layers. Section A comprises the substrate 3, the adhesive 5, 6 and 7, and the cover layer 4. That is, neither the first conductive terminals 1 nor the conductive patterns 2 exist in the section A. Section B comprises the first conductive terminals 1, the substrate 3, the adhesive 5, 6 and 7, and the cover layer 4 but not the conductive patterns 2. Section C comprises the conductive patterns 2, the substrate 3, the adhesive 5, 6 and 7, and the cover layer 4 but not the first conductive terminals 1. Section D comprises both the first conductive terminals 1 and the conductive patterns 2, the substrate 3, the adhesive 5, 6 and 7, and the cover layer 4.

When another conductive material is glued onto the first conductive terminals 1 in the window 8 of the above FPC, the only portions having good electrical conductance with the opposite conductive material are portions D, the thickest portions, due to the characteristics of the anisotropic conductive adhesive as described above.

If the area ratio of the portions D to each first conductive terminal 1 is small, the conductivity of the first conductive terminals 1 for external connections undesirably decreases. Therefore, as shown in FIG. 2, a plurality of dummy patterns 2-1 are provided in the rear of the first conductive terminals 1 to fill up the blank spaces between the conductive patterns 2, with the result that the area ratio of the portions D to the first conductive terminals 1 becomes constant.

If the portions D are misdistributed, not enough conductivity or proper adhesion can be obtained. Consequently, the conductive patterns 2 are arranged to be dispersed everywhere in the rear of the first conductive terminals 1.

As is clear from the foregoing description, when a first group of conductive terminals on a front surface of an FPC, said FPC having a group of conductive patterns on the rear surface thereof, are glued to a different group of conductive terminals of a different circuit board by the anisotropic conductive adhesive, the wiring at high density can be realized with using the rear surface of the FPC. Additionally, enough strength of adhesion and enough conductivity between the first and the different groups of conductive terminals are obtained, since the first conductive terminals and the conductive patterns in the rear thereof are arranged to overlap each other uniformly everywhere in the glued area.

As can be appreciated, many of the parameters of the above FPC can be varied within conventional knowledge, since they are interdependent depending upon terms of time, temperature, concentration, etc while the present invention has been described with reference to the particular embodiments mentioned above, it should be understood that numerous modifications may be made by those skilled in the art without actually departing from the spirit an scope of the invention, which should be determined solely from the following claims.

What is claimed is:

1. A flexible printed circuit board comprising:
   an insulating flexible substrate;
   an adhesion area on a front surface of said substrate, said adhesion area capable of being glued to a different electrical element by an anisotropic conductive adhesive;
   a plurality of first conductive terminals disposed in at least said adhesion area on the front surface of said substrate for providing external connections, said first conductive terminals in said adhesion area capable of being glued and connected to a plurality of different conductive terminals of the different electrical element by the anisotropic conductive adhesive; and
   a plurality of conductive patters disposed on a rear surface of said substrate, said first conductive terminals in said adhesion area partly overlaying while partly not overlaying said rear conductive patterns.

2. The flexible printed circuit board of claim 1 wherein both the first conductive terminals and the rear conductive patterns are arranged in the adhesion area so that the percentage of the portions where the first conductive terminals and the rear conductive patterns overlay each other at each first conductive terminal is generally constant, and so that the overlaying portions are dispersed across the adhesion area.

3. The flexible printed circuit board of claim 2 further comprising a plurality of dummy patterns additionally disposed to fill up the blank spaces either between the first conductive terminals on the front surface of the substrate or between the conductive patterns on the rear surface percentage of the portions where the first conductive terminals and the conductive patterns overlay each other at each terminal may be generally constant, and so that the overlapping portions may be dispersed everywhere at each conductive terminal.

4. The flexible printed circuit board of claim 3 wherein the dummy patterns are disposed to fill up the blank spaces between the conductive patterns on the rear side of the substrate.

5. The flexible printed circuit board of claim 1 wherein the conductive patterns are perpendicular to the first conductive terminals.

6. The flexible printed circuit board of claim 2 wherein each of the conductive terminals overlaying with a plurality of the conductive patterns.

7. A flexible printed circuit board comprising:
   an insulating flexible substrate;
   a first conductive terminal pattern to be glued and connected to a terminal pattern on another electrical element; and
   a conductive pattern disposed on a rear surface of said substrate, said conductive pattern being arranged so that an overlaying between said first terminal pattern and said conductive pattern occurs and does not occur alternately along said first terminal pattern.

8. A flexible printed circuit board comprising:
   an insulating flexible substrate;
   a first conductive terminal pattern to be glued and connected to a terminal pattern on another electrical element;
   a conductive pattern disposed on a rear surface of said substrate; and
   a dummy pattern also disposed on a rear surface of said substrate to provide a first overlaying between said first terminal pattern and said dummy pattern.

9. The flexible printed circuit board of claim 8, wherein said conductive pattern is arranged to provide a second overlaying between said first conductive terminal and said conductive pattern.

10. An improved flexible printed circuit board comprising:
    a flexible substrate;
    a first conductive terminal pattern attached to one side of the substrate;
    a second conductive terminal pattern attached to the other side of the substrate; and having terminal portions that overlay the first conductive terminal pattern to provide a cross-sectional sandwich construction of a first conductive terminal portion, a substrate portion and a second conductive terminal portion at only select positions across the substrate while providing nonoverlay positions at the remaining positions of the substrate, and
    means for providing a spacer, of approximately the same dimensions of the terminal portions, at the nonoverlay positions to ensure a uniform thickness or the cross-sectional construction whereby conductivity and adhesion can be increased when a conductive adhesive is used to connect the conductive terminals to another electrical connection.

11. The improved flexible printed circuit board of claim 10 wherein the means for providing includes a third conductive pattern that is not connected to the first or second conductive pattern for forming the spacer.

* * * * *